United States Patent [19]
Hirai

[11] Patent Number: 4,811,303
[45] Date of Patent: Mar. 7, 1989

[54] INTEGRATED CIRCUIT MEMORY WITH COMMON ADDRESS REGISTER AND DECODER

[75] Inventor: Hayao Hirai, Nagoya, Japan

[73] Assignee: Mitsubishi Denki Kabushiki Kaisha, Tokyo, Japan

[21] Appl. No.: 933,156

[22] Filed: Nov. 21, 1986

[30] Foreign Application Priority Data

Nov. 22, 1985 [JP] Japan ................................. 60-262870

[51] Int. Cl.$^4$ ........................ G11C 7/00; G11C 11/40
[52] U.S. Cl. ..................................... 365/189; 365/94; 365/104; 365/185; 365/230; 235/380
[58] Field of Search ............... 365/189, 230, 182, 218, 365/520; 364/403–406; 235/382.5, 382, 380, 379, 492

[56] References Cited

U.S. PATENT DOCUMENTS

| 3,702,464 | 11/1972 | Castrucci | 365/52 X |
|---|---|---|---|
| 4,105,156 | 8/1978 | Dethloff | 235/441 |
| 4,442,345 | 4/1984 | Mollier et al. | 235/382.5 X |
| 4,532,419 | 7/1985 | Takeda | 235/492 |
| 4,610,000 | 9/1986 | Lee | 365/189 |
| 4,650,981 | 3/1987 | Foletta | 235/492 X |
| 4,684,791 | 8/1987 | Bito | 235/382 X |
| 4,692,601 | 9/1987 | Nakano | 235/442 X |
| 4,701,601 | 10/1987 | Francini et al. | 235/380 X |
| 4,705,211 | 11/1987 | Honda et al. | 235/380 |
| 4,734,568 | 3/1988 | Watanabe | 235/380 X |
| 4,736,094 | 4/1988 | Yoshida | 235/379 |

OTHER PUBLICATIONS

Blitz 20 Dialogue System (Att. #5).
Blitz 20 Dialogue System Translation (Att. #4).
Motorola MC6805k2 (Att. #7).
Motorola MC68120 (Att. #8).
Motorola M50760-XXXP/FP (Att. #9).
Hitachi HM6264 (Att. #11).
Hitachi HN58064 (Att. #2).
Maxell Memory Cartridge (Att. #10).

Primary Examiner—Stuart N. Hecker
Assistant Examiner—Alyssa H. Bowler
Attorney, Agent, or Firm—Bernard, Rothwell & Brown

[57] ABSTRACT

An integrated circuit memory which can be applied, for example, to a memory device of a dialogue type tool information interface for an NC machine tool or a memory unit of various identification cards, comprises a fixed memory unit where necessary information is fixedly stored and the information cannot be rewritten, and a rewrite memory unit where necessary information among information of various sorts supplied from the interface or the card read/write apparatus can be rewritten if necessary, and the fixed memory unit and the rewrite memory unit are integrated in one chip or a single body of one module.

13 Claims, 5 Drawing Sheets

INTEGRATED CIRCUIT MEMORY WITH COMMON ADDRESS REGISTER AND DECODER

BACKGROUND OF THE INVENTION

1. Field of the Invention

The present invention relates to an integrated circuit memory wherein a plurality of integrated circuits (hereinafter referred to as "IC") of different types are combined into hybrid form, and more specifically to an integrated circuit memory which is applied, for example, to a dialogue type machine tool and rewrites information of various sorts regarding works detected by sensors, or which is applied, for example, to an identification card and rewrites information to be updated into a new one, so that permanent storage information and rewriting storage information are stored in respective memory units and each memory unit is integrated into one chip or one module.

2. Description of the Prior Art

In the prior art, a memory integrated into one chip or one module is exemplified in random access memory (hereinafter referred to as "RAM") having feature in difference of access method or read only memory (hereinafter referred to as "ROM") having feature in memory holding state. Particularly the ROM is exemplified in a mask ROM for storing information which must be fixedly held, and a programmable ROM (hereinafter referred to as "PROM") which can set to change the stored information by a write operation. The PROM includes, for example, a fuse type PROM where erase or rewrite is impossible after the information has been written once, a diode junction destruction type PROM being a memory fixing type, an erasable PROM (hereinafter referred to as "EPROM") where erase and rewrite can be performed repeatedly, an electrical alterable PROM (hereinafter referred to as "EAPROM") being a memory charging type, and the like. The EPROM performs erase of the stored information by means of irradiation by ultraviolet rays or the like, whereas the EAPROM performs erase or rewrite of the stored information electrically and is also called an electrically erasable PROM hereinafter referred to as "E²PROM"). These IC memories are tabulated in TAB. 1 described on next page.

Each memory element may be used with any portion of electronic equipment corresponding to its use, function or the like. Regarding manufacturing of the IC memory, one chip or one module is formed, for example, through (1) thermal oxidation process, (2) thermal diffusion process, (3) epitaxial layer growth accelerating process, (4) window making process, (5) wiring process, (6) nitride film coating process, (7) bonding process, (8) packaging process, thereby the IC memory having constant function and constant capacity is completed.

TABLE 1

The storage function of these IC memories will be described. In the MASKROM and the PROM, once information data is written the information cannot be rewritten. In the EPROM, once information is written, the written information can be erased and then the information can be written. In the RAM, information can be written or rewritten freely, but if the power source is interrupted the written information is erased. In the E²PROM, information can be written electrically, and even if the power source is interrupted the written information can be held as it is.

In general, in order to constitute a memory, IC memories each having single function such as RAM, MASKROM, PROM, EPROM, E²PROM are used in suitable combination, and assembled together with a peripheral device to control these memories on a substrate so that required function is provided.

The IC memories assembled as above described in the prior art are assembled as external memory elements of a numerical control machine tool for example, and perform storage, holding and update of various values such as length of a work, diameter, cutting speed, life of a tool, and the like. An example of such IC memories is disclosed in "Tool Dialogue System" in "Search Report of Trend in Basic Studies" March 1985, pp 156–157, by "Japan Machine Tool Buiders' Association".

Since the memory in the prior art is constituted as above described, IC memories each having a single function must be used in combination and assembled on a substrate; thereby the memory becomes large-scale and expensive. Moreover, since utilization in assembling in an identification card or an identification module is difficult, such memory in the prior art cannot be applied to products which are compact and portable.

Memory cell arrays having the required functions among required elements of the above-mentioned IC memories may be combined into one chip. However, for example, the read write memory (RWM) and the ROM are different from each other in set voltage, drive voltage or reset voltage and therefore cannot use the same address register. Consequently, even if the IC memories are formed into one chip, respective system constitutions are required to perform the drive control and therefore the circuit constitution at the side of the terminal end machine is complicated and the benefits of one-chip forming cannot be obtained.

SUMMARY OF THE INVENTION

In order to eliminate the above-mentioned disadvantages in the prior art, an object of the invention is to provide an IC memory which has a compound memory function and is cheap and compact and moreover can be applied to a compact portable article such as an identification memory card or an identification module.

An IC memory according to the invention comprises an IC memory unit where necessary data is stored nearly permanently and rewrite of data becomes impossible and an IC memory unit where data can be rewritten if necessary, and both IC memory units are constituted on one chip or into one module in hybrid arrangement.

DETAILED DESCRIPTION OF THE PREFERRED EMBODIMENTS

Embodiments of IC memories according to the invention will now be described referring to the accompanying drawings.

Figure 1:
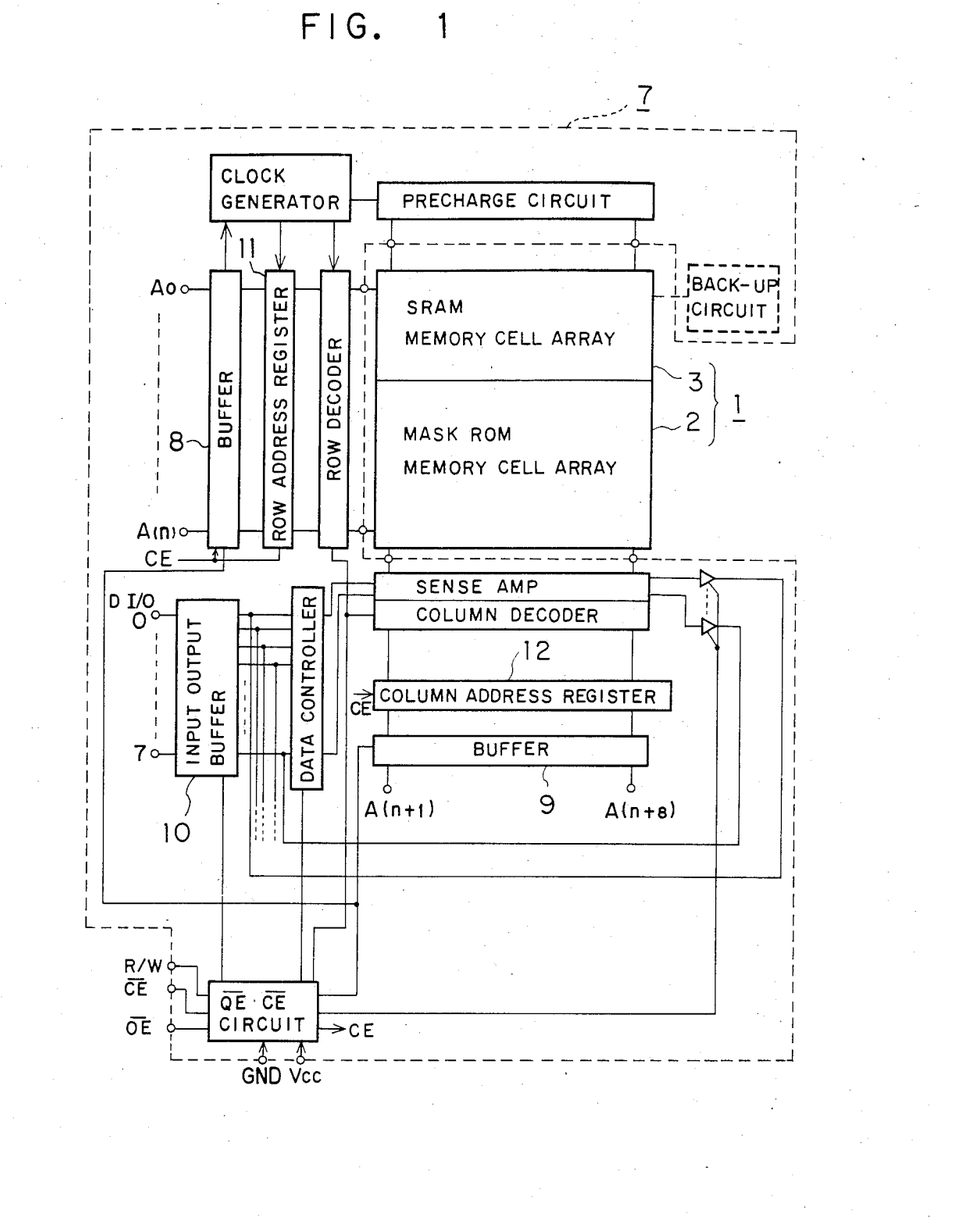
FIG. 1 is a block diagram of an IC memory as a first embodiment of the invention where a combination of memory cell arrays of No. 23 in TAB. 2 is applied as a memory device of a tool dialogue system in an NC machine tool for example.

FIG. 1 shows a first embodiment of the invention. In FIG. 1, an IC memory 1, which is made of one chip or a single body of one module, comprises a mask ROM memory cell array 2 for storing definite fixed information with non-volatility, i.e., nearly permanently, and a static RAM memory array 3 installed integrally with the mask ROM 2 within the one chip and having access time for information reading at particularly high speed. The chip of the IC memory 1, although more or less different depending on bipolar type or MOS type, for example, performs thermal oxidation of a surface of a silicon (Si) wafer so as to form an oxide film of $SiO_2$ or the like, and applies a photosensitive film (photoresist) thereto, and then ultraviolet ray is irradiated thereon through a photo mask and thereby photoresist phenomenon occurs. A circuit pattern is drawn on the photo mask formed on the wafer in the above-mentioned process. If corrosion is performed on the photo mask using a corrosive liquid of mixed acid such as hydrofluoric acid (HF), the photoresist becomes an anticorrosive film and the exposed oxide film is solely corroded thereby the ground coat of silicon (Si) is exposed and the photoresist thin film remaining finally is subjected to thermal diffusion; thus the photo mask of IC is manufactured. And then the surface side is coated by a nitride film so as to form a protective film, and bonding or packaging is performed if necessary; thus an IC chip is manufactured. When the IC memory is not formed in a chip but applied, for example, to ID card as single body of one module, in place of bonding or packaging, plastics may be molded into card form and input/output terminals are formed on the card surface.

The IC memory manufactured through the above-mentioned process into above-mentioned constitution can be assembled in a dialogue type interface circuit of an NC machine tool for example. In order to perform storage and rewrite of various data such as length of a tool, diameter, abrasion and life, information interchange is performed by buffers 8, 9 and an input/output buffer 10 of a storage information read/rewrite apparatus 7 shown in FIG. 1. The mask ROM 2 and the static RAM (SRAM) 3 of the IC memory 1 can use a row address register 11 and a column address register 12 commonly; thereby constitution of peripheral equipment is simplified. Set voltage, reset voltage and drive voltage are made the same.

The above description represents an embodiment of the invention, and combination of memory cell arrays in the IC memory of the invention may be performed on the basis of following criterion.

(1) combination of at least one sort between unit which cannot be rewritten (e.g., MASKROM unit or PROM unit) and
(a) unit which can be rewritten (e.g., RAM unit)
(b) unit which can be rewritten (e.g., EPROM unit)
(c) unit which can be rewritten (e.g., $E^2PROM$ unit)

(2) combination of at least one sort between unit which cannot be rewritten conditionally (e.g., EPROM unit) and
(a) unit which can be rewritten (e.g., RAM unit)
(b) unit which can be rewritten (e.g., EPROM unit)
(c) unit which can be rewritten (e.g., $E^2PROM$ unit)

(3) combination of at least one sort between unit which cannot be rewritten conditionally (e.g., $E^2$-PROM unit) and
(a) unit which can be rewritten (e.g., RAM unit)
(b) unit which can be rewritten (e.g., $E^2PROM$ unit)

(4) combination of at least one sort between unit which cannot be rewritten (e.g., MASKROM unit) and unit which is written at any time and then cannot be rewritten (e.g., PROM unit) and
(a) unit which can be rewritten (e.g., RAM unit)

(b) unit which can be rewritten (e.g., EPROM unit)

(c) unit which can be rewritten (e.g., E²PROM unit)

(5) combination of at least one sort between unit which cannot be rewritten (e.g., MASKROM unit) and unit which is written at any time and then cannot be rewritten (e.g., EPROM unit) and (a) unit which can be rewritten (e.g., RAM unit)

(b) unit which can be rewritten (e.g., EPROM unit)

(c) unit which can be rewritten (e.g., E²PROM unit)

(6) combination of at least one sort between unit which cannot be rewritten (e.g., MASKROM unit) and unit which is written at any time and then cannot be rewritten (e.g., E²PROM unit) and (a) unit which can be rewritten (e.g., RAM unit)

(b) unit which can be rewritten (e.g., E²PROM unit)

In addition to combination of IC memory units of two or three sorts as above described, various sorts of IC memory units can be combined corresponding to uses. TAB. 2 illustrates the combination performed freely. In the table, regulation numbers with symbol ○ represent embodiments shown in FIGS. 1 through 5.

TABLE 2

COMBINATION OF MEMORY CELL ALLAYS SYMBOL ○ REPRESENTS EMBODIMENTS SHOWN IN FIG. 1-FIG. 5

| NO. | 1st ORDER | 2nd ORDER | 3rd ORDER | 4th ORDER |
|---|---|---|---|---|
| 1 | MASK | EPROM | | |
| 2 | " | " | EPROM | |
| 3 | " | " | E²PROM | |
| 4 | " | " | RAM | |
| 5 | " | " | EPROM | EPROM |
| 6 | " | " | EPROM | E²PROM |
| 7 | " | " | EPROM | RAM |
| 8 | " | " | E²PROM | E²PROM |
| 9 | " | " | E²PROM | RAM |
| ⑩ | MASK | PROM | EPROM | |
| 11 | " | " | | E²PROM |
| 12 | " | " | | RAM |
| 13 | " | " | EPROM | EPROM |
| 14 | " | " | " | E²PROM |
| 15 | " | " | " | RAM |
| 16 | " | " | E²PROM | E²PROM |
| 17 | " | " | " | RAM |
| 18 | MASK | E²PROM | | |
| 19 | " | " | E²PROM | |
| 20 | " | " | RAM | |
| 21 | MASK | E²PROM | E²PROM | E²PROM |
| 22 | " | " | " | RAM |
| ㉓ | " | RAM | | |
| 24 | PROM | EPROM | | |
| 25 | " | " | EPROM | |
| 26 | " | " | E²PROM | |
| 27 | " | " | RAM | |
| 28 | " | " | EPROM | EPROM |
| 29 | " | " | " | E²PROM |
| 30 | " | " | " | RAM |
| 31 | " | " | E²PROM | E²PROM |
| ㉜ | " | " | " | RAM |
| ㉝ | PROM | E²PROM | | |
| 34 | " | " | E²PROM | |
| 35 | " | " | RAM | |
| 36 | " | " | E²PROM | E²PROM |
| 37 | " | " | " | RAM |
| 38 | " | RAM | | |
| 39 | EPROM | EPROM | | |
| 40 | " | " | EPROM | |
| 41 | EPROM | EPROM | | |
| 42 | " | " | EPROM | |
| 43 | " | " | E²PROM | |
| 44 | " | " | RAM | |
| 45 | " | " | EPROM | EPROM |
| 46 | " | " | EPROM | E²PROM |
| 47 | " | " | EPROM | RAM |
| 48 | EPROM | E²PROM | | |
| 49 | " | " | E²PROM | |
| 50 | " | " | RAM | |

TABLE 2-continued

COMBINATION OF MEMORY CELL ALLAYS SYMBOL ○ REPRESENTS EMBODIMENTS SHOWN IN FIG. 1-FIG. 5

| NO. | 1st ORDER | 2nd ORDER | 3rd ORDER | 4th ORDER |
|---|---|---|---|---|
| 51 | " | " | E²PROM | E²PROM |
| 52 | " | " | E²PROM | RAM |
| 53 | " | RAM | | |
| 54 | E²PROM | E²PROM | | |
| 55 | " | " | E²PROM | |
| 56 | " | " | RAM | |
| 57 | " | " | E²PROM | E²PROM |
| 58 | " | " | E²PROM | RAM |
| 59 | " | RAM | | |
| ㊿ | MASK | PROM | EPROM | E²PROM SPAM |

Figure 2:
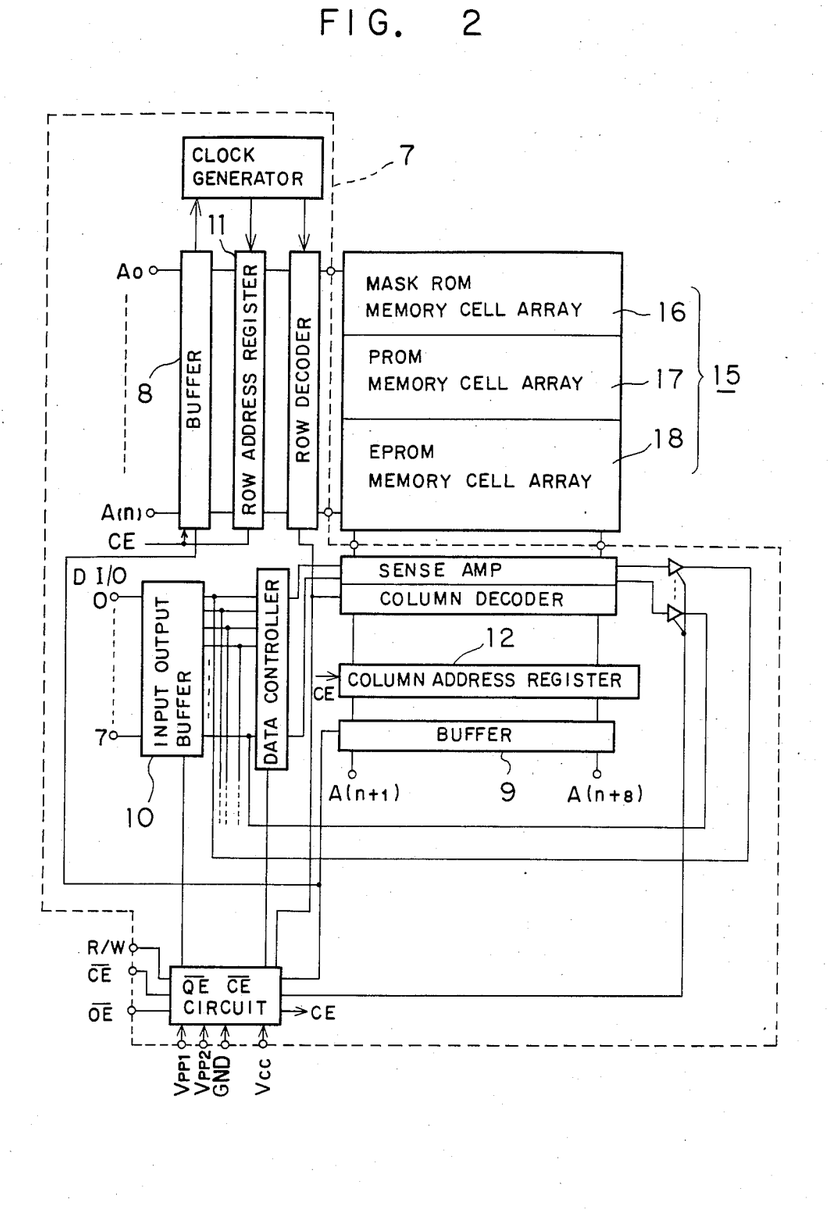
FIG. 2 is a block constitution diagram of an IC memory as a second embodiment of the invention in application of a combination of memory cell arrays of No. 10 in TAB. 2.

FIG. 2 is a block constitution diagram of an IC memory as a second embodiment of the invention according to criterion (4) (b) and combination of No. 10 of TAB. 2. The IC memory 15 comprises a mask ROM memory cell array 16, PROM memory cell array 17, and EPROM memory cell array 18. A storage information read/rewrite apparatus 7 has the same constitution as that of FIG. 1.

Figure 3:
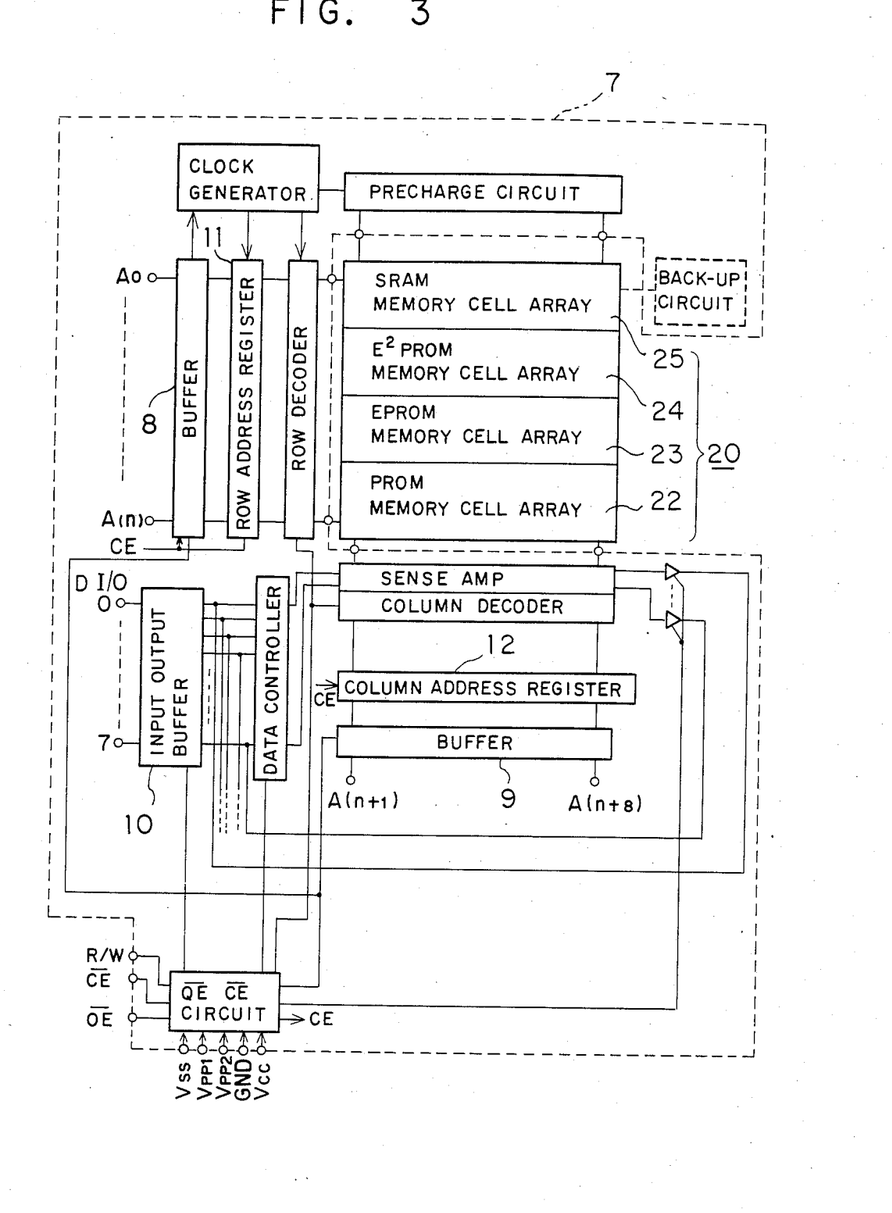
FIG. 3 is a block constitution diagram of an IC memory as a third embodiment of the invention in application of a combination of memory cell arrays of No. 32 in TAB. 2.

FIG. 3 is a block constitution diagram of an IC memory as a third embodiment of the invention according to combination of No. 32 in TAB. 2. The IC memory 20 comprises PROM memory cell array 22, EPROM memory cell array 23, E²PROM memory cell array 24 and SRAM memory cell array 25, all constituted in one chip or single body of one module.

In the invention, as shown in above-mentioned second and third embodiments, storage functions of the IC memories are combined (any of combinations (1)-(6) and TAB. 2) thereby IC memory is constituted on one chip or single body of one module is constituted in hybrid arrangement; thereby IC memory having compound storage function is constituted in appearance as a single body of one module and utilized. The IC memory in such constitution is compact and therefore can be applied to an identification card or an identification module.

Figure 4:
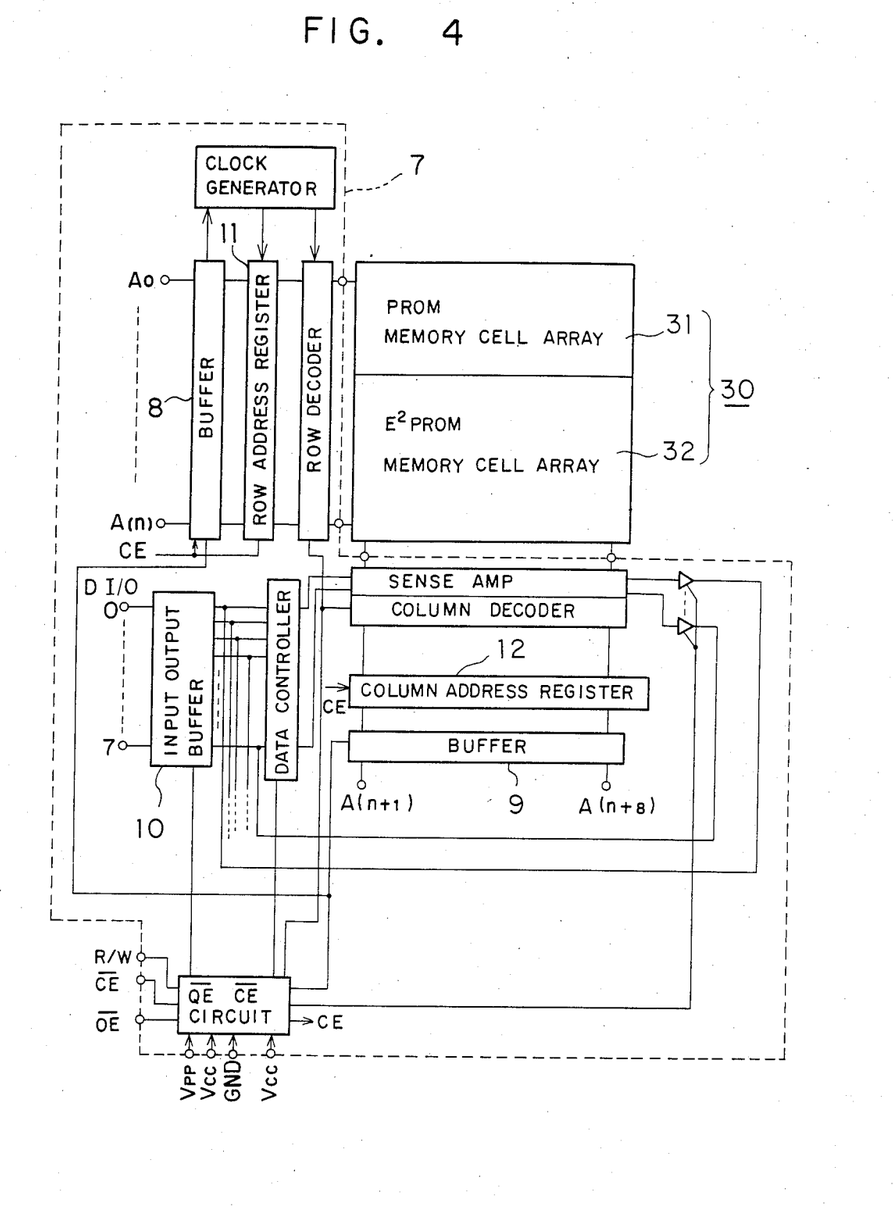
FIG. 4 is a block constitution diagram of an IC memory as a fourth embodiment of the invention in application of a combination of memory cell arrays of No. 33 in TAB. 2.

For example, as shown in a fourth embodiment of FIG. 4, application of combination of (1) (c) and No. 33 of TAB. 2 (PROM unit+E²PROM unit) to an identification card 30 will be described concretely. IC memory unit which cannot be rewritten in the identification card 30, PROM unit 31 in this case, is written nearly permanently by data which must not be erased and not be rewritten under any condition after being written by encoding once, such as bank name, personal name, machine name, module name, confidential number. In the unit which can be rewritten in the same IC memory within the same identification card, E²PROM unit 32 in this case, data which vary corresponding to conditions, such as saving balance, machine working time, module use time are rewritten freely at any time of rewrite. In this constitution, the IC memory does not cause trouble due to erase of an important part by mistake but can be applied in the use where data varying economically also can be refreshed every time it is required.

When the IC memory is formed in single body of one module, although depending on the capacity of IC memory, it can be made of a dimension of about diameter 8 (mm)×thickness 3 (mm) for example.

Figure 5:
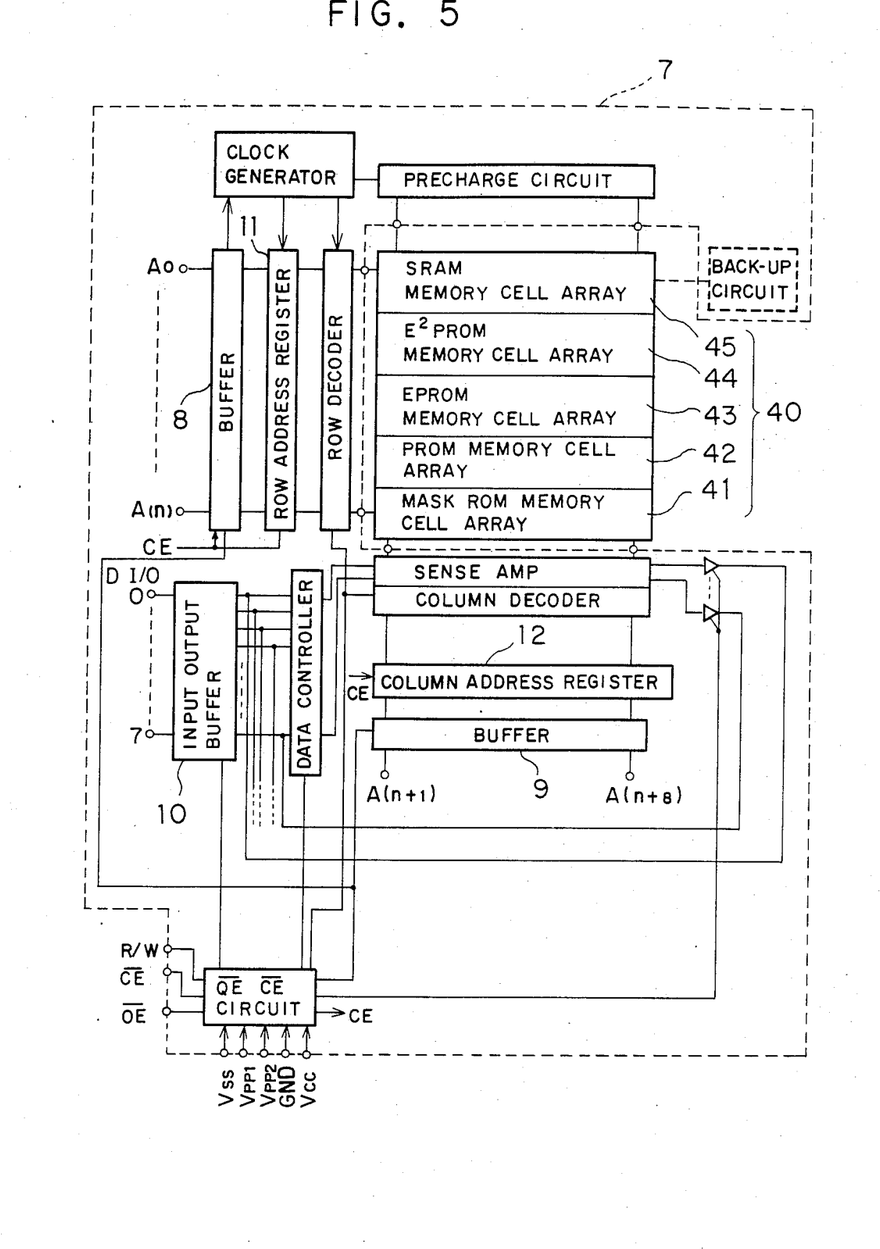
FIG. 5 is a block constitution diagram of an IC memory as a fifth embodiment of the invention in application of a combination of memory cell arrays of No. 60 in TAB. 2.

When further highly integrating technology is used, a combination of memory cell arrays can be constituted concretely as a fifth embodiment shown in FIG. 5 according to No. 60 of TAB. 2. The IC memory 40 in the fifth embodiment comprises a mask ROM memory cell array 41, PROM memory cell array 42, EPROM memory cell array 43, E$^2$PROM memory cell array 44, and SRAM memory cell array 45. Memory elements having five different characteristics can be constituted in one chip or a single body of one module by means of highly integrating technology.

In the invention, in addition to above-mentioned combination functions, any IC memory of one chip or one module may be used as long as it has a read/write memory unit and a read only memory unit.

According to the invention as above described, since the IC memory has a read only memory function and a read/write memory function and is constituted in one chip or one module, a memory having a compound memory function can be made compact and cheap and therefore can be applied to a wide use field such as an identification card or an identification module.

What is claimed is:

1. An integrated circuit (IC) memory comprising
   a fixed memory unit where necessary information is fixedly stored and the stored information cannot be rewritten;
   a rewrite memory unit where necessary information among information of various sorts inputted in the circuit can be rewritten if necessary;
   said fixed memory unit and said rewrite memory unit being integrated in one chip;
   an information read/write apparatus integrated in the chip and including a common address register with common decoder means for accessing the fixed memory unit and the rewrite memory unit, and a common output buffer means for receiving data read out from locations in the fixed memory unit and the rewrite memory unit accessed by the common decoder means; and
   the fixed memory unit and the rewrite memory unit formed into one chip performing information processing of various sorts regarding tools of an NC machine tool, and being assembled as a memory device of a tool system.

2. An integrated circuit memory as set forth in claim 1, wherein the fixed memory unit is constituted by memory cell array of a mask read only memory (MASKROM) having complete nonvolatility nd high reliability in information holding, and the rewrite memory unit is constituted by memory cell array of a static random access memory (SRAM) having access time at high speed and small storage density.

3. An integrated circuit memory as set forth in claim 1, wherein the fixed memory unit is constituted by a programmable read only memory (PROM) which can set the fixed information by performing write operation one time with a mask ROM, and the rewrite memory unit is constituted by an erasable and programmable read only memory (EPROM) which can erase information by irradiation of ultraviolet ray and perform rewrite.

4. An integrated circuit memory as set forth in claim 1, wherein the fixed memory unit is constituted by PROM being programmable, and the rewrite memory unit is constituted by EPROM where stored information can be erased or written, and an electrical erasable and programmable read only memory (E$^2$PROM) which can be rewritten electrically, and SRAM of high speed access.

5. An integrated circuit memory as set forth in claim 1, wherein the fixed memory unit is constituted by PROM being programmable, and the rewrite memory unit is constituted by E$^2$PROM being erasable electrically.

6. An integrated circuit memory as set forth in claim 1, wherein the fixed memory unit is constituted by MASKROM having high reliability and PROM being programmable, and the rewrite memory unit is constituted by EPROM being erasable and written, E$^2$PROM being electrically erasable and written, and SRAM to enable high speed access.

7. An integrated circuit (IC) memory comprising
   a fixed memory unit where necessary information is fixedly stored and the stored information cannot be rewritten;
   a rewrite memory unit where necessary information among information of various sorts inputted in the circuit can be written if necessary;
   said fixed memory unit and said rewrite and unit being integrated in one chip;
   an information read/write apparatus integrated in the chip and including a common address register with common decoder means for accessing the fixed memory unit and the rewrite memory unit, and a common output buffer means for receiving data read out from locations in the fixed memory unit and the rewrite memory accessed by the common decoder means; and
   the fixed memory unit and the rewrite memory unit formed into one module being constituted as a memory device of an identification card assembled in a plastic card for identifying information of various sorts.

8. An integrated circuit memory as set forth in claim 7, wherein the identification card with the fixed memory unit and the rewrite memory unit assembled therein is used for bank trading, and PROM unit as the fixed memory unit stores information by encoding, such as bank name, personal name, machine name, module name and confidential code, and E$^2$PROM unit as the rewrite memory unit stores information changed corresponding to conditions, such as saving balance, machine working time and module use time.

9. An integrated circuit memory as set forth in claim 7, wherein the fixed memory unit is constituted by memory cell array of a mask read only memory (MASKROM) having complete nonvolatility and high reliability in information holding, and the rewrite memory unit is constituted by memory cell array of a static random access memory (SRAM) having access time at high speed and small storage density.

10. An integrated circuit memory as set forth in claim 7, wherein the fixed memory unit is constituted by a programmable read only memory (PROM) which can set the fixed information by performing write operation one time with a mask ROM, and the rewrite memory unit is constituted by an erasable and programmable read only memory (EPROM) which can erase information by irradiation of ultraviolet ray and perform rewrite.

11. An integrated circuit memory as set forth in claim 7, wherein the fixed memory unit is constituted by PROM being programmable, and the rewrite memory unit is constituted by EPROM where stored information can be erased or written, and an electrical erasable and programmable read only memory (E$^2$PROM)

which can be rewritten electrically, and SRAM of high speed access

12. An integrated circuit memory as set forth in claim 7, wherein the fixed memory unit is constituted by PROM being programmable, and the rewrite memory unit is constituted by E²PROM being erasable electrically.

13. An integrated circuit memory as set forth in claim 7, wherein the fixed memory unit is constituted by MASKROM having high reliability and PROM being programmable, and the rewrite memory unit is constituted by EPROM being erasable and written, E²PROM being electrically erasable and written, and SRAM to enable high speed access.

* * * * *

UNITED STATES PATENT AND TRADEMARK OFFICE
CERTIFICATE OF CORRECTION

PATENT NO. : 4,811,303

DATED : March 7, 1989

INVENTOR(S) : Hayao Hirai

It is certified that error appears in the above-identified patent and that said Letters Patent is hereby corrected as shown below:

Column 5, line 48, insert the numeral --24-- between the numerals "23" and "25".

Column 7, line 47, "nd" should be --and--.

Signed and Sealed this

Third Day of April, 1990

Attest:

HARRY F. MANBECK, JR.

*Attesting Officer*     *Commissioner of Patents and Trademarks*